United States Patent [19]  [11] 3,982,908
Arnold  [45] Sept. 28, 1976

[54] NICKEL-GOLD-COBALT CONTACT FOR SILICON DEVICES

[75] Inventor: Anthony Francis Arnold, Ringoes, N.J.

[73] Assignee: RCA Corporation, New York, N.Y.

[22] Filed: Nov. 20, 1975

[21] Appl. No.: 633,690

[52] U.S. Cl. .................................. 29/195; 29/199; 29/589; 357/71
[51] Int. Cl.² ..................... B32B 15/04; H01L 29/46
[58] Field of Search ................ 29/195 S, 199, 589; 357/71

[56] References Cited
UNITED STATES PATENTS

| | | |
|---|---|---|
| 2,739,420 | 5/1957 | Johnston et al. .................. 29/195 X |
| 3,169,304 | 2/1965 | Gould ................................. 29/589 |
| 3,268,309 | 8/1966 | Frank et al. ........................ 29/195 |
| 3,396,454 | 8/1968 | Murdock et al. ................ 29/589 X |
| 3,551,842 | 12/1970 | Nelson ............................ 357/71 X |

Primary Examiner—L. Dewayne Rutledge
Assistant Examiner—E. L. Weise
Attorney, Agent, or Firm—Glenn H. Bruestle; Arthur E. Wilfond; Ronald L. Yin

[57] ABSTRACT

A contact for a silicon device comprises a sintered nickel layer on the silicon, a layer of gold over the sintered nickel layer, and a layer of cobalt on the layer of gold.

7 Claims, 2 Drawing Figures

NICKEL-GOLD-COBALT CONTACT FOR SILICON DEVICES

BACKGROUND OF THE INVENTION

The present invention relates to ohmic contacts to silicon devices and more particularly to plated ohmic contacts.

Heretofore, plated ohmic contacts to some silicon devices have been made by plating the silicon with a layer of nickel. Nickel is used because when nickel is sintered at a temperature range of about 575°C to 625°C for about 10–30 minutes in a reducing atmosphere, such as 10% $H_2$ and 90% $N_2$, nickel will alloy with the silicon to form a strong bond. Sometimes a higher temperature, such as 800°C, is also used.

The alloying of nickel and silicon, however, results in nickel silicide surface which is only partially metallic in nature. Poor mechanical bonds are established between thermal or electrical leads and the sintered nickel layer, i.e. thermal or electrical leads soldered to the sintered nickel layer do not form high strength bonds. Thus, frequently a second layer of metal is plated over the sintered nickel layer, to protect the sintered nickel layer from oxidation and to form a layer to which thermal or electrical leads can be soldered. In addition, the second layer of metal must form a strong bond with the sintered nickel layer in order to insure a mechanically strong contact.

Gold has been used as the second layer of metal (see e.g. U.S. Pat. No. 3,169,304). Gold will alloy with the sintered nickel at a temperature of above about 300°C to form a strong bond. This temperature can be achieved when thermal or electrical leads are subsequently soldered onto the layer of gold. LThe heat of the soldering operation is sufficient to strengthen the sintered nickel-gold bond. However, at comparable thickness, gold is more porous than other metals, such as cobalt. Thus, a relatively thick and stable layer of gold must be applied to the sintered nickel layer to prevent the sintered nickel layer from oxidation. A relatively thick and stable layer of gold is difficult to apply and is expensive.

SUMMARY OF THE INVENTION

A contact for a silicon device comprises a sintered nickel layer on the silicon, a layer of gold over the sintered nickel layer, and a layer of cobalt on the gold layer. The layer of cobalt serves to protect the underlying layer of sintered nickel from oxidation and to form a strong bond with the layer of gold without the need for further processing. Thus, a thin layer of gold is used as a bonding layer to which cobalt can form a strong bond and with which the sintered nickel layer can form a strong bond.

DETAILED DESCRIPTION OF THE INVENTION

Figure 1:
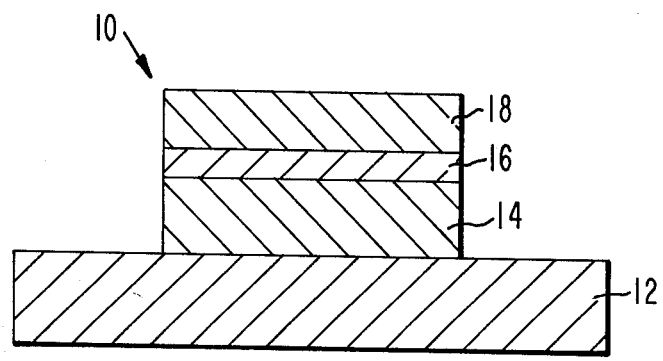
FIG. 1 is a cross-sectional view of a contact of the present invention on a silicon body.

Referring initially to FIG. 1, there is shown a contact of the present invention, generally designated as 10, on a silicon body 12. The contact 10 comprises a layer of sintered nickel 14 on the silicon body 12. A layer of gold 16 is directly on the sintered nickel layer 14 and a layer of cobalt 18 is directly on the gold layer 16. The improvement of the present invention lies in the addition of the cobalt layer 18 to the gold layer 16.

The contact 10 is made by depositing a layer of nickel on the silicon body 12 by any conventional nickel plating process. The nickel is then sintered at a temperature range of about 575°C to 625°C for about 10–30 minutes in a reducing atmosphere, such as 10% $H_2$ and 90% $N_2$, to form the sintered nickel layer 14. Thus far, the plating of the layer of nickel and the sintering of the nickel layer to form sintered nickel layer 14 are well-known in the art. The layer of gold 16 can be plated on the sintered nickel layer 14 by any conventional gold plating process. Once the gold layer 16 is plated on the sintered nickel layer 14 to the desired thickness, the gold-plated body is transferred immediately from the gold plating solution to the cobalt plating solution with minimal rinsing and exposure to air or other oxidizing atmosphere, in order to avoid the possibility of oxide formation on the sintered nickel layer 14. The underlying layer of sintered nickel 14 can be oxidized, even though there is a layer of gold 16 over it, because a thin layer of gold is porous to oxygen. The cobalt layer 18 is plated on the gold layer 16 also by any conventional cobalt plating process.

In the present invention a strong chemical bond exists between the three layers of material, i.e. between cobalt layer 18, gold layer 16, and sintered nickel layer 14. When nickel is plated on the silicon body 12 and is then sintered to form sintered nickel layer 14, it is believed that nickel alloys with the silicon to form nickel silicide. In the present invention, a thin layer of gold 16, between about 1 A to about 1,000 A in thickness, is plated over the sintered nickel 14. Typically the layer of gold 16 is about 150 A thick. The bond between the gold layer 16 and the sintered nickel layer 14 can be strengthened by heating it to a temperature of about 400°C. This temperature can be achieved when electrical leads are subsequently soldered onto the cobalt layer 18. The heat of the soldering operation is sufficient to strengthen the sintered nickel-gold bond. When a cobalt layer 18 is plated onto the gold layer 16, a natural strong chemical bond is formed, without the need for further processing to strengthen the gold-cobalt bond. The layer of cobalt 18 is between about 500 A to about 10,000 A in thickness; a typical thickness is about 3,000 A.

It should be appreciated that the present invention is an improvement over U.S. Pat. No. 3,169,304. In that patent, the layer of gold must be relatively thick and stable, to protect the underlying layer of sintered nickel from oxidation, and to provide physical support for the contact. In the contact of the present invention, it is the layer of cobalt 18 which serves to protect the underlying layer of sintered nickel from oxidation, and to provide physical support for the contact 10. To achieve the same function of protecting the underlying layer of sintered nickel from oxidation, the layer of gold used in U.S. Pat. No. 3,169,304 must be thicker than the layer of cobalt 18 used in the present invention, because at comparable thickness, cobalt is less porous than gold to oxygen. Finally, a thick layer of gold is substantially less economical and more difficult to apply than a comparable thick layer of cobalt. The contact of the present invention is useful when electrical or thermal leads are desired to be attached to the silicon.

Many soldering operations are more efficiently performed on a nickel surface than on a cobalt surface.

Figure 2:
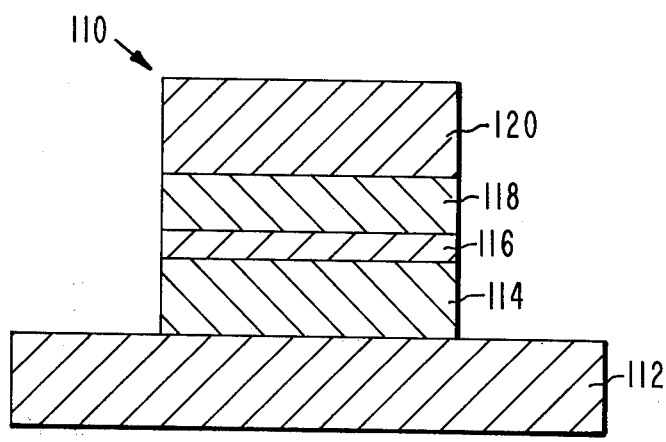
FIG. 2 is a cross-sectional view of another contact of the present invention on a silicon body.

Referring to FIG. 2, there is shown a cross-sectional view of another contact of the present invention, generally designated as 110 on a silicon body 112. The contact 110 is similar to the contact 10 of FIG. 1, except with the addition of a layer of nickel on the cobalt. The contact 110 comprises a layer of sintered nickel 114 on the silicon body 112. A layer of gold 116 is on the sintered nickel layer 114 and a layer of cobalt 118 is on the gold layer 116. Finally, a layer of nickel 120 is on the cobalt layer 118. The nickel layer 120 is between about 500 A and about 1,000 A in thickness.

The contact 110 is made in a manner similar to the contact 10 of FIG. 1 with respect to applying the sintered nickel layer 114, the gold layer 116 and the cobalt layer 118. The layer of nickel 120 on the cobalt layer 118 can be deposited by any conventional nickel plating process. The advantages of the contact 10 of FIG. 1 are, of course, also present in the contact 110 of FIG. 2. This embodiment has the advantage that the layer of cobalt 118 serves not only as a strongly bonded support layer but also acts as a barrier for the diffusion of the nickel layer 120 to the gold layer 116 during the subsequent soldering operation.

What is claimed is:
1. A contact for a silicon device comprising
   a layer of sintered nickel directly on said silicon device;
   a layer of gold directly on said layer of sintered nickel; and
   a layer of cobalt directly on said layer of gold.
2. The contact of claim 1, wherein said layer of gold is between about 1 A and about 1,000 A in thickness.
3. The contact of claim 2, wherein said layer of cobalt is between about 500 A and about 10,000 A in thickness.
4. The contact of claim 1, wherein said contact further comprises a layer of nickel on said layer of cobalt.
5. the contact of claim 4, wherein said layer of nickel is between about 500 A and about 1,000 A in thickness.
6. The contact of claim 5, wherein said layer of gold is between about 1 A and about 1,000 A in thickness.
7. The contact of claim 6, wherein said layer of cobalt is between about 500 A and about 10,000 A in thickness.

* * * * *